United States Patent [19]

Sundhar

[11] Patent Number: 5,042,258
[45] Date of Patent: Aug. 27, 1991

[54] DRINKING CONTAINER

[76] Inventor: Shaam P. Sundhar, 87 Juniper Ave., Westerville, Ohio 43081

[21] Appl. No.: 390,032

[22] Filed: Aug. 7, 1989

[51] Int. Cl.$^5$ .............................................. F25B 21/02
[52] U.S. Cl. ...................................... 62/3.2; 62/3.62; 62/457.9
[58] Field of Search ............... 62/3.2, 3.6, 3.62, 457.9, 62/3.3

[56] References Cited

U.S. PATENT DOCUMENTS

| | | |
|---|---|---|
| 2,991,628 | 7/1961 | Tuck .................................... 62/3.62 |
| 3,310,953 | 3/1967 | Rait ...................................... 62/3.62 |
| 3,314,242 | 4/1967 | Lefferts ........................... 62/3.62 X |
| 3,402,561 | 9/1968 | Mahoney ............................. 62/3.62 |
| 4,581,898 | 4/1986 | Preis ................................... 62/3.62 |
| 4,759,190 | 7/1988 | Trachtenberg et al. .............. 62/3.62 |

Primary Examiner—Lloyd L. King
Attorney, Agent, or Firm—Biebel, French & Nauman

[57] ABSTRACT

An apparatus for dispensing and storing a food product is provided. This apparatus includes a container comprising a cup portion having a cup insert removably detachable from an insulative shell which has cylindrical sidewall, a top edge, and a bottom planar portion. The cup portion has a heat conductive portion positioned between the insulative shell and the cup insert. The apparatus also includes a thermoelectric chip with means for supplying power for the thermoelectric chip with the chip positioned between a heat sink and the heat conductive portion. In one embodiment of the invention, the heat sink includes fins which depend downwardly from the bottom of the cup portion, while in the preferred embodiment of the invention, the fins extend outwardly from a main wall parallel to the longitudinal axis of the cup portion.

14 Claims, 6 Drawing Sheets

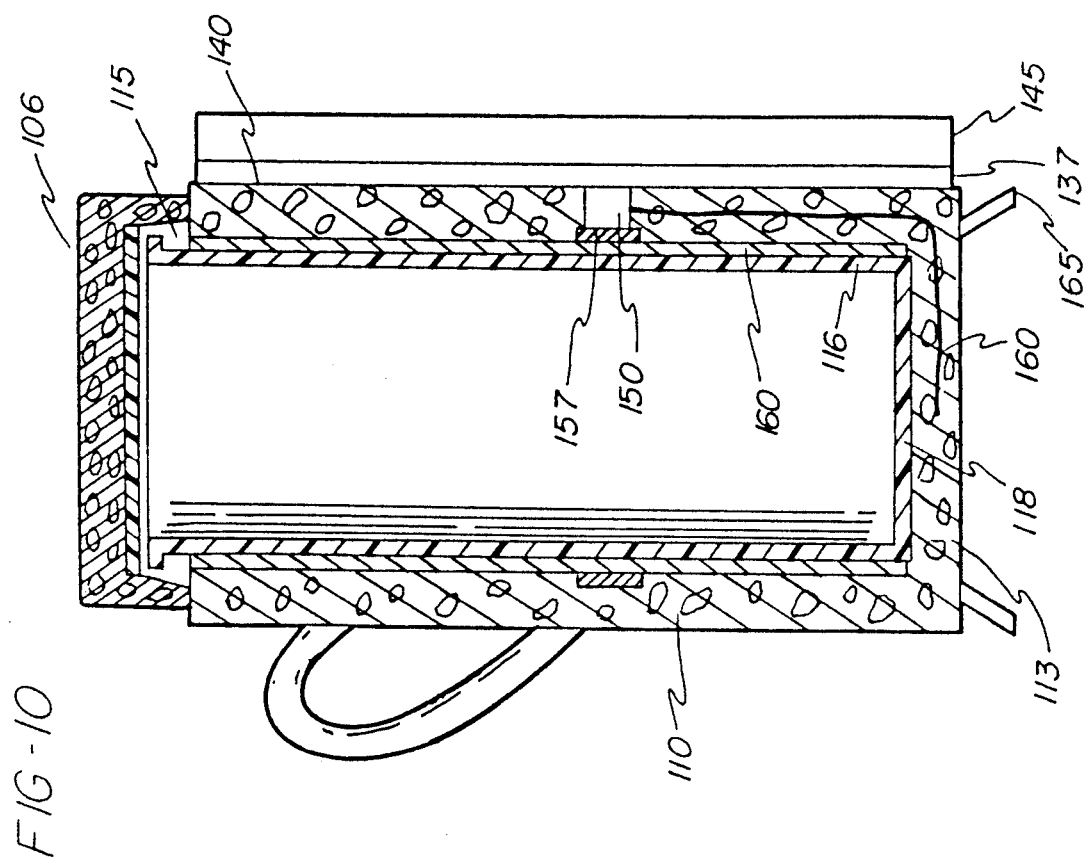
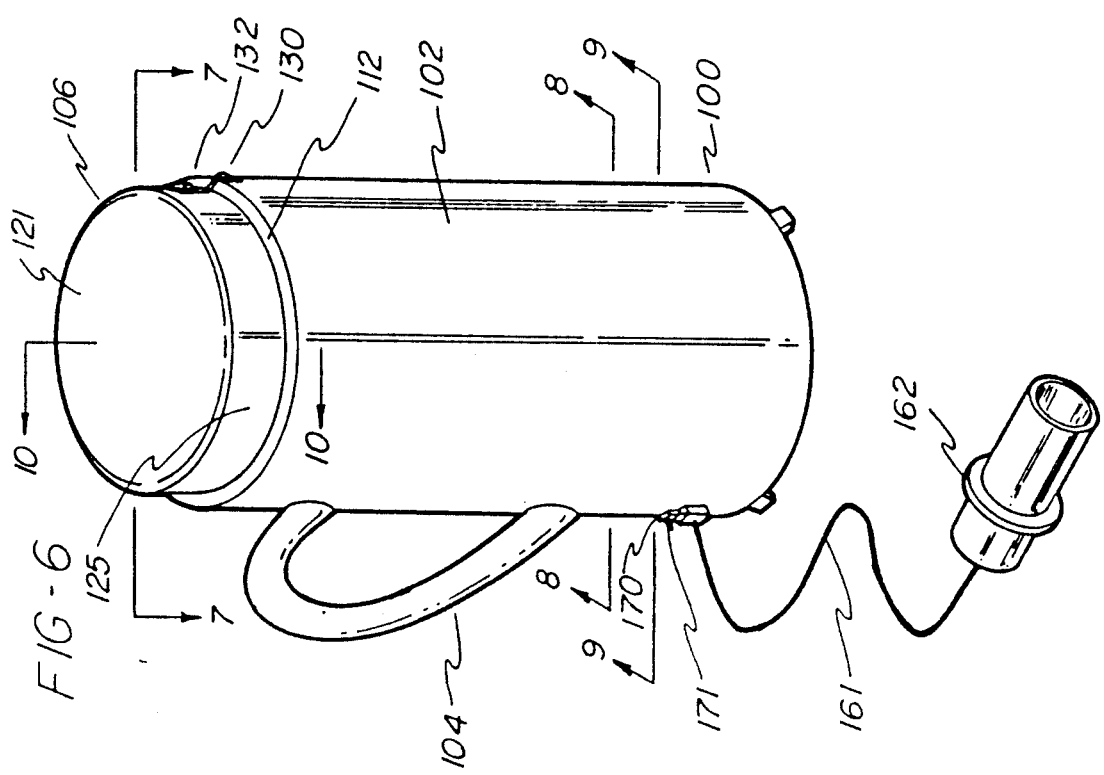

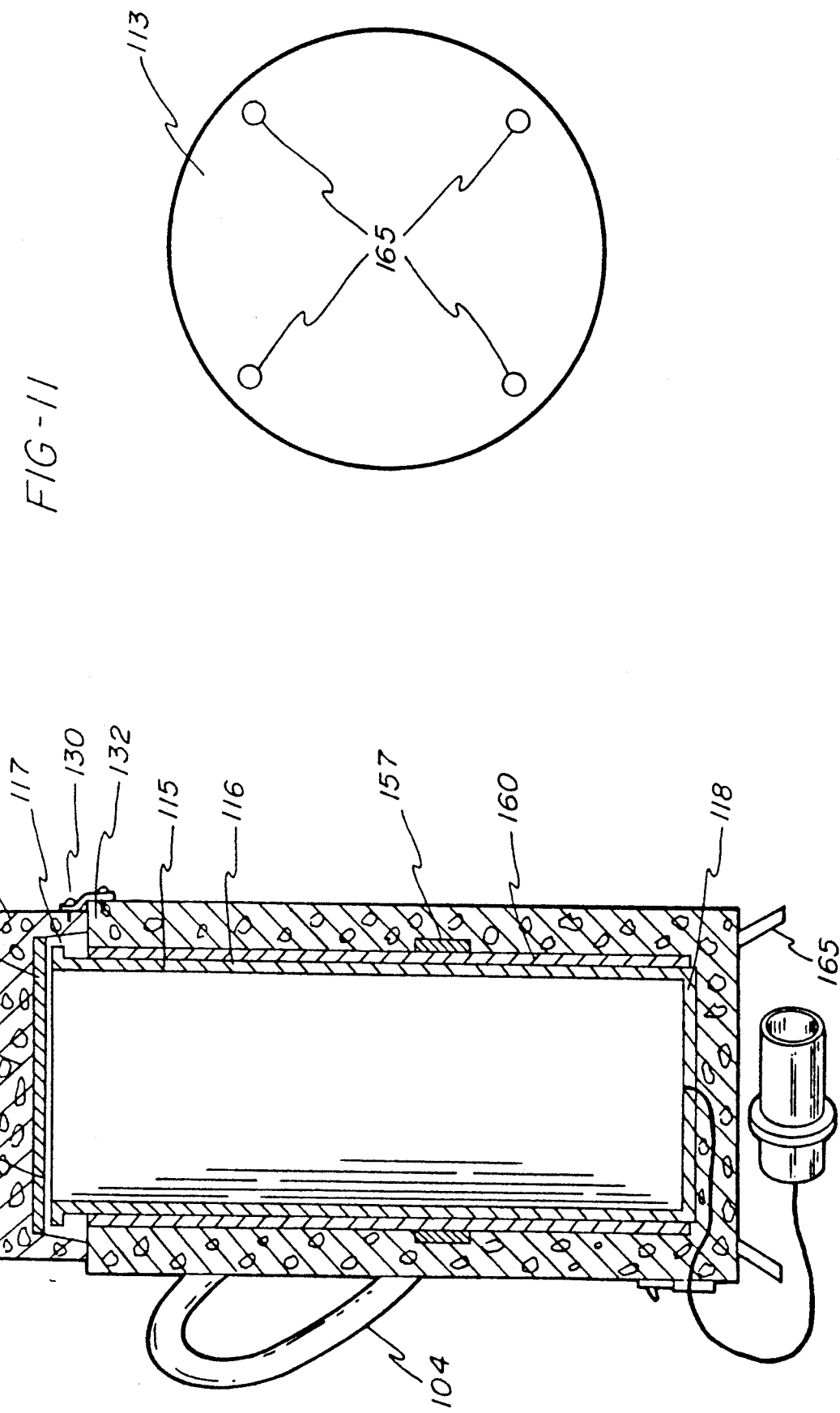

DRINKING CONTAINER

BACKGROUND OF THE INVENTION

The present invention relates generally to an apparatus for storing and dispensing of food product, and more particularly to one which can be used in vehicles such as cars, trucks, or boats.

Travelers or other individuals using vehicles for transportation or enjoyment desire to partake of liquid refreshment. While such refreshment is preferably consumed hot or cold, the desired temperature of consumption often dissipates prior to completion of drinking. Attempts have been made to mitigate the problem, such as the providing of enclosed plastic cups for use with heated beverages, and the providing of foam insulated containers for holding refrigerated cans of beverages such as soft drinks or iced tea. However, both of these approaches merely seek to reduce the rate at which the beverage ultimately becomes lukewarm, and often undesirable. The problem is aggravated in situations involving vehicles, since heating or cooling means such as hot plate, microwave ovens or refrigerators are impractical.

Thermoelectric refrigerating appliances are known to exist. Examples of such refrigerating units include Mueller, U.S. Pat. No. 3,220,198; Mueller U.S. Pat. No. 3,324,667; Beitner U.S. Pat. No. 4,107,934; Beitner U.S. Pat. No. 4,383,414; Sudmier U.S. Pat. No. 3,194,023; and Sarbacher U.S. Pat. No. 3,664,144. All of the above, with the exception of Sarbacher disclose actual refrigeration units, whose sole purpose is to store food products. Sarbacher discloses a self-powered refrigerated disposable container which makes use of a thermoelectric cooling device placed within a cavity of the container to cool the contents thereof. Thus, none of the above patents disclose the utilization of thermoelectric technology with a dispenser capable of providing individualized consumption of a food product, while at the same time being capable of storing the as yet unused portion.

It is thus apparent that the need exists for an improved apparatus for storing and dispensing a food product, which apparatus can heat or cool the food product so that it may be consumed at a desirable temperature.

SUMMARY OF THE INVENTION

There is disclosed an apparatus for dispensing a food product. The apparatus comprises a cup portion having a cup insert removably detachable from an insulative shell. The shell has a cylindrical sidewall, a top edge, and a bottom planar portion with the top portion having a heat conductive portion positioned between the insulative shell and the cup insert. The apparatus also comprises a thermoelectric chip positioned between a heat sink and the heat conductive portion with means for supplying the power for the thermoelectric chip. The cup insert is preferably fabricated from a heat conductive material. The heat sink is preferably comprised of a main wall and a plurality of fins depending perpendicularly therefrom. In one embodiment of the invention the heat conductive portion is positioned between the bottom planar portion and the cup insert. The bottom planar portion has a bottom surface with the bottom surface being positioned directly adjacent to the heat sink. In another embodiment of the invention, the heat conductive portion forms a heat conductive sheet positioned between the cup insert and the insulative shell. Preferably the sheet is cylindrical and is directly adjacent to the cup insert.

Other features of the invention include an insulated cover which at least partially encloses a top plate, and a handle secured to the cup portion. Additionally, the thermoelectric chip used in this invention may have its polarity reversed. The means for supplying power is connected to an adapter capable of connection to the electrical system of the vehicle in which the device is used such as via the cigarette lighter.

There is also disclosed a beverage cooler for use in an automotive vehicle comprising a cup portion having a cup insert removably detachable from an insulative shell, the shell having a cylindrical sidewall, a top edge and a bottom planar portion. The cup portion has a heat conductive portion positioned between the insulative shell and the cup insert. The heat conductive portion forms a cylindrical heat conductive sheath positioned between the cup insert and the insulative shell directly adjacent to cup insert. The cup portion also has an insulated cover at least partially enclosing a top plate. The beverage cooler also comprises a thermoelectric chip positioned between a heat sink and the heat conductive portion, with the heat sink being comprised of a main wall and a plurality of fins depending perpendicularly therefrom, with the apparatus having means for supplying power for the thermoelectric chip.

It is the primary object of the present invention to provide an apparatus for holding and permitting the dispensing of a food product, preferably a beverage, at a desirable temperature of consumption while at the same time providing for the storage of the remaining unused food product.

Yet another important object of this invention is to provide a thermoelectric apparatus for dispensing a beverage which is relatively inexpensive to fabricate as well as being of a relatively compact size.

Still yet another important object of the present invention is to provide an apparatus for storing and dispensing a beverage which can be utilized to dispense both cooled or chilled, as well as hot beverages, without having to worry about the beverages becoming lukewarm.

Other objects and advantages of the invention will be apparent from the following description, the accompanying drawings, and the appended claims.

BRIEF DESCRIPTION OF THE DRAWINGS

FIG. 6 is a perspective view of the apparatus of the preferred embodiment of the invention.

FIG. 7 is a vertical sectional view taken along line 7—7 of FIG. 6.

FIG. 10 is a vertical sectional view taken along line 10—10 of FIG. 6.

FIG. 11 is a bottom plan view.

DETAILED DESCRIPTION OF THE INVENTION

Figure 1:
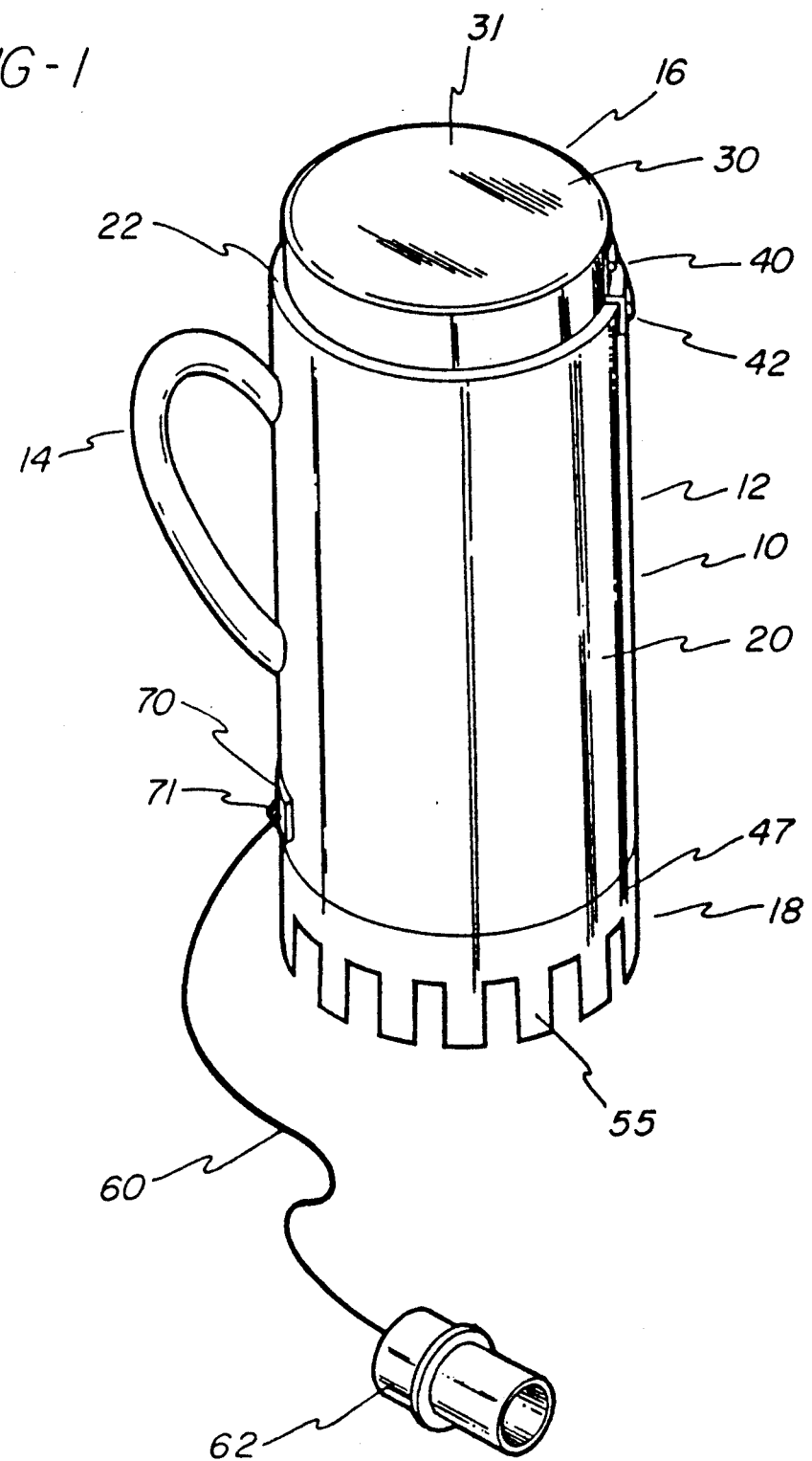
FIG. 1 is a perspective view of the apparatus for storing a food product in accordance with the present invention.

Having reference to the drawings, attention is directed first to FIG. 1 which illustrates an apparatus for storing and dispensing a food product embodying this invention designated generally by the numeral 10. The primary components of the invention are a cup portion 12, handle 14, top 16, and heat sink 18.

Figure 2:
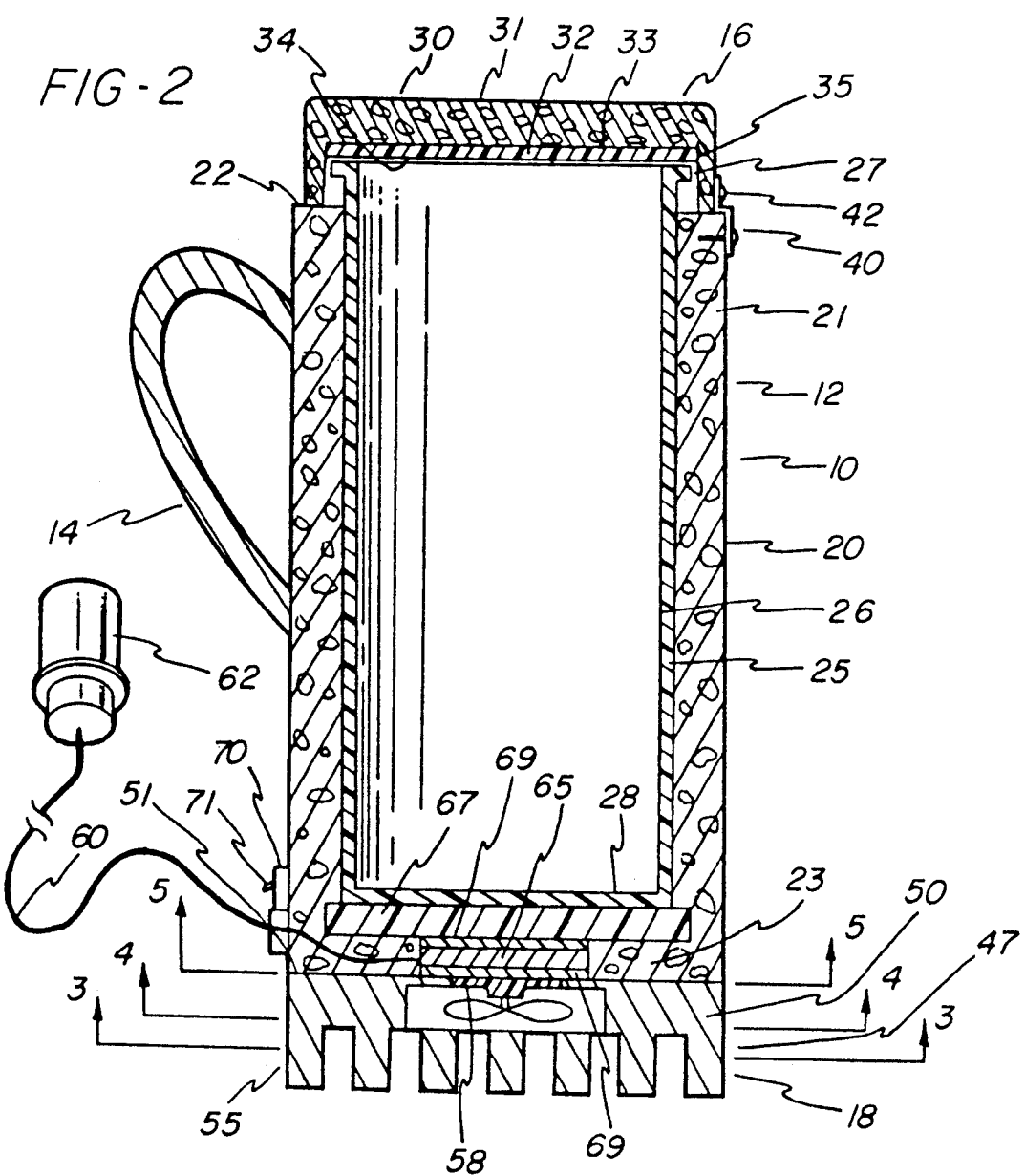
FIG. 2 is a vertical sectional view taken along line 2—2 of FIG. 1.
Figure 3:
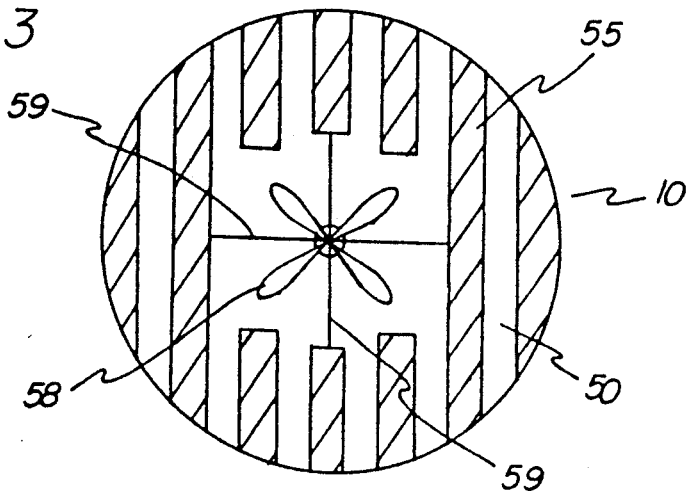
FIG. 3 is a horizontal sectional view taken along line 3—3 of FIG. 2.
Figure 4:
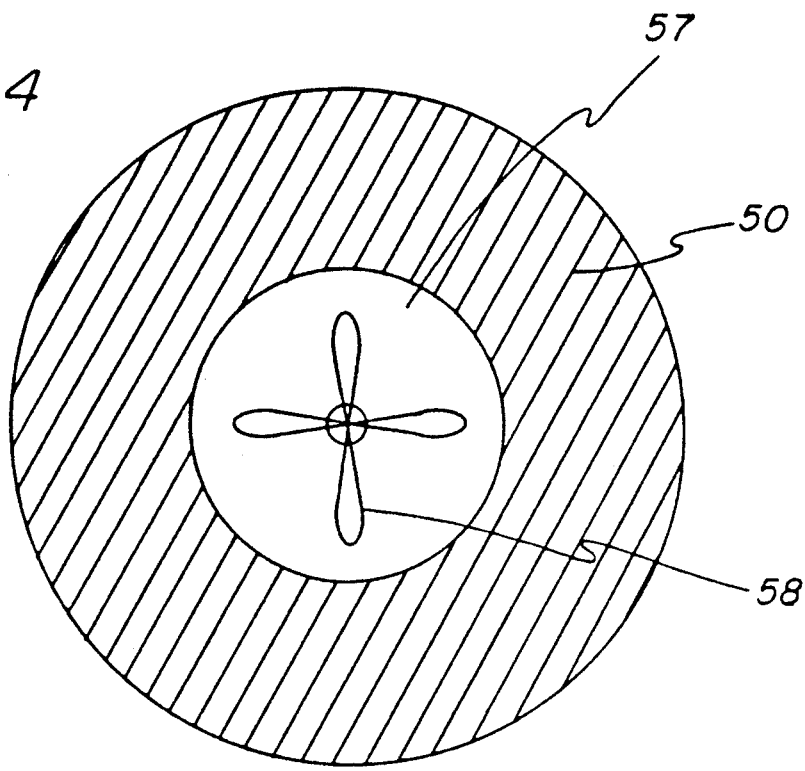
FIG. 4 is a horizontal sectional view taken along line 4—4 of FIG. 2.
Figure 5:
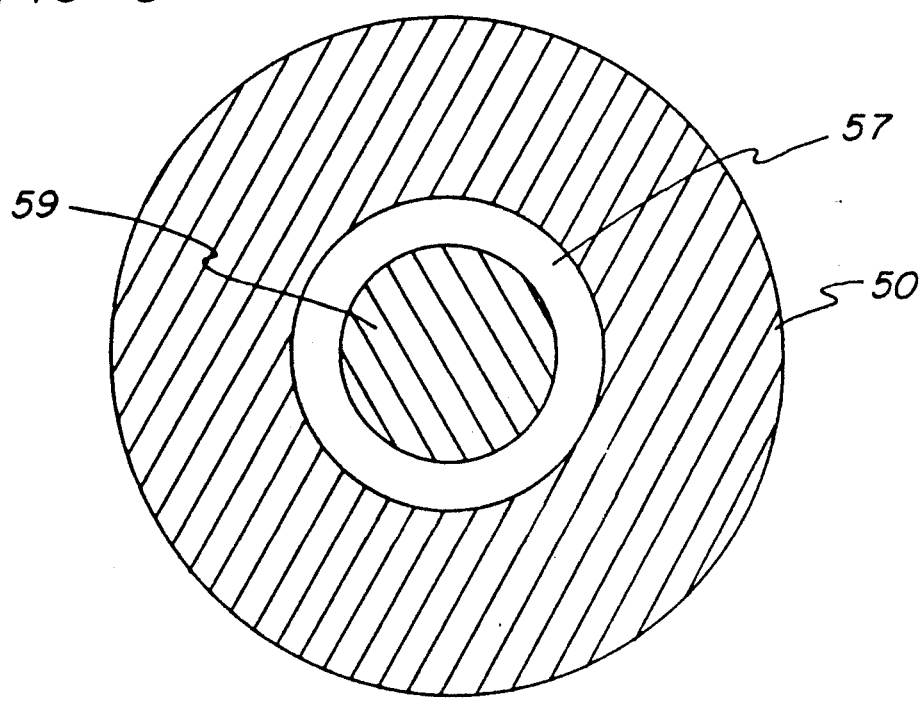
FIG. 5 is a horizontal sectional view taken along line 5—5 of FIG. 2.
Figure 8:
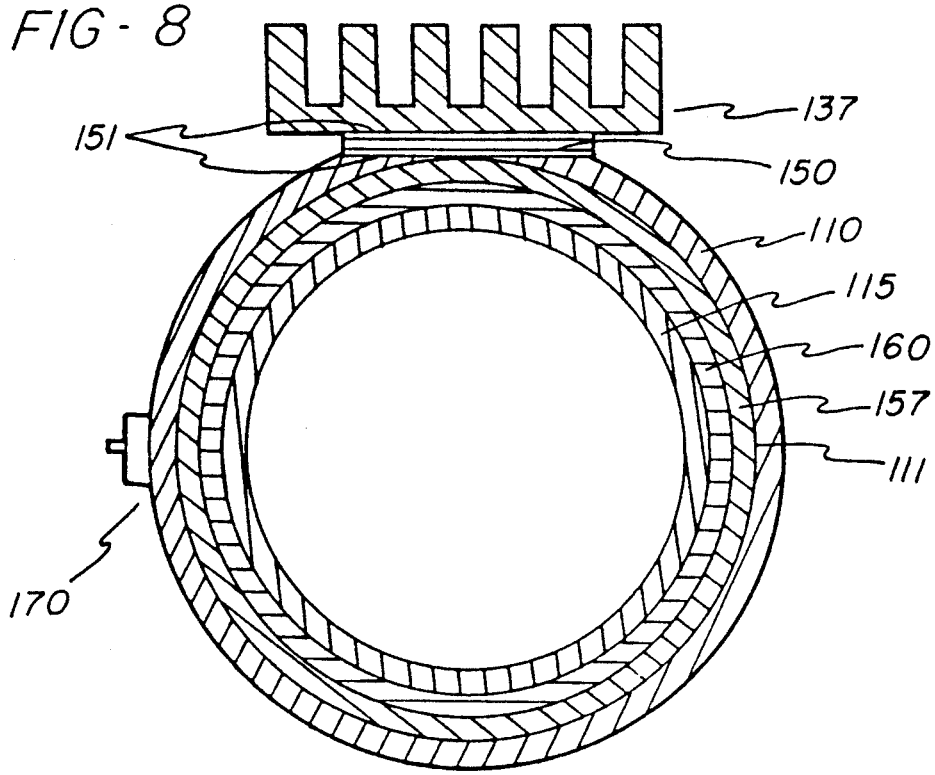
FIG. 8 is a horizontal sectional view taken along line 8—8 of FIG. 6.
Figure 9:
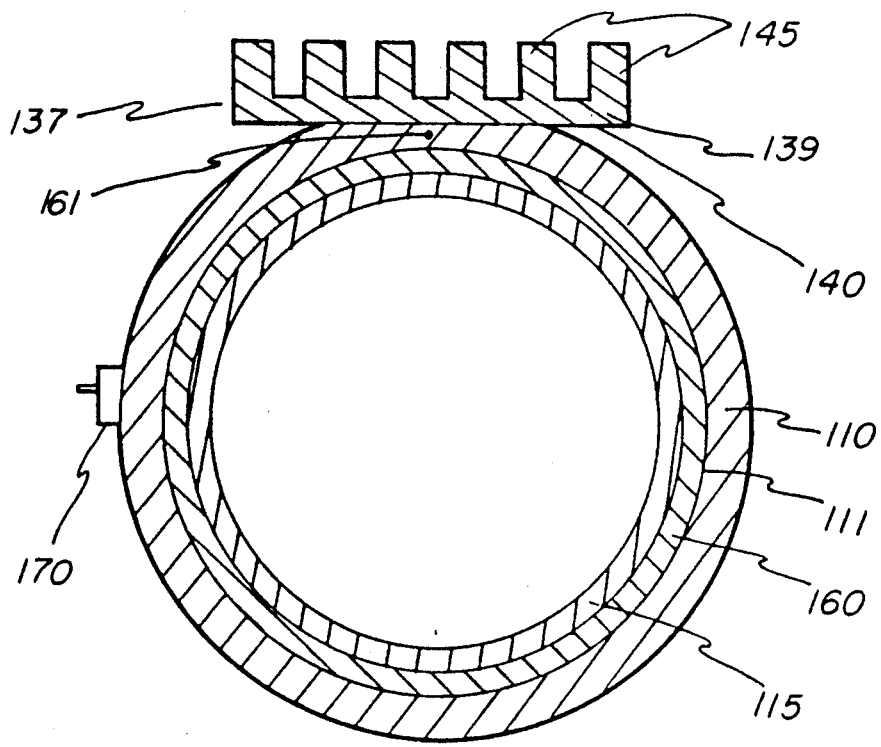
FIG. 9 is a horizontal sectional view taken along line 9—9 of FIG. 6.

As can be seen in FIGS. 1 and 2, the cup portion 12 is comprised of a foam outer liner 20 which forms an insulative shell having a cylindrical liner sidewall 21, a liner top edge 22, and a planar bottom portion 23 having bottom surface 24. A cup insert 25, preferably of a heat conducting metal such as aluminum, may be secured just inwardly of the cylindrical liner 21 of insulative shell 20. The cup insert 25 has an insert sidewall 26, an outwardly flanged top 27 and a cup bottom 28.

Additionally, the top is shown as comprising an insulated cover 30 having a cover outer surface 31. A metallic heat conductive top plate 32, preferably also fabricated from aluminum, has a top surface 33, plate bottom surface 34, and edge 35 and is at least partially enclosed by the insulated cover 30. The top 16 is secured to the cup portion 12 by hinge means 40 with fastening means 42 securing hinge means 40 to the respective cup portion 12 and top 16. As can be seen in FIGS. 2-5, the heat sink 18 is comprised of an upper portion 47 having a main wall 50 with main wall top surface 51 and a plurality of fins 55 which in this embodiment depend downwardly from main wall 50. A fan opening 57 is provided for accommodation of a cooling fan 58. Fan supports 59 secure the fan 58 to the apparatus. Power for the fan is provided by a circuit 60 having a plug 62 which can be inserted into the cigarette lighter provided in most vehicles.

A thermoelectric chip 65 is positioned between a heat conductive portion 67 of the cup portion 12 and the heat sink 18. The thermoelectric chip is held in position by adhesive layers 69. The thermoelectric chip is typical of those already in existence, such as Marlow Industry's MI 1099 or Melcore's thermoelectric chips. The apparatus also has a control box 70 with switching means 71 which permit the reversal of the polarity of the thermoelectric chip so that the heat conductive portion may either cool or heat the beverage contained in cup insert 25. The switching means 171 may include a 3-way toggle switch which provides for the "off" position as well as cooling and heating position.

FIGS. 6-11 disclose the preferred embodiment of this invention designated generally by the numeral 100. This apparatus also has a cup portion 102, handle 104, top 106, and heat sink 108. Insulative shell 110 comprises a cylindrical liner sidewall 111, a liner top edge 112, and a planar bottom portion 113. The cup insert 115 having insert sidewall 116 flanged top 117, and cup bottom 118 may be inserted into the insulative shell 110. The apparatus also has an insulative cover 120 having a cover outer surface 121, a top plate 122, having a top surface 123, a plate bottom surface 124, and an edge 125. Hinge means 130 secure the top 106 to cup portion 102 with the hinge means being secured to the top and cup portion by fastening means 132. Heat sink 108 comprises a plate portion 137 having a main wall 139 and main wall front surface 140 with fins 145 depending perpendicularly from the main wall 139. The fins extend outwardly from the main wall which is parallel to the longitudinal axis of the cup portion.

The thermoelectric chip 150 is secured by adhesive layers 151 between heat conductive portion 157, which is in the form of a band, and the main wall front surface 140. A heat conductive sheath 160 which may be semicircular but preferably is cylindrical extends about cup insert 115. In the preferred embodiment of the invention, the height of the sheath is approximately 4.75" while the height of the band is approximately 1.2". In this embodiment the heat sink preferably is 5" high, 4.4" wide, and 1.3" deep. In both embodiments of the invention the cup insert is preferably formed of 0.16" stainless steel with a height of 5.25 and a diameter of approximately 2.5". The heat conductive portion is preferably formed of aluminum, with heat conductive portion 67 preferably being 0.5" thick and in direct contact with the stainless steel cup insert.

Additional dimensions associated with the invention include a 0.5" insulated foam thickness, a 0.25" thick top plate, and a fan of approximately 1" in diameter. In the embodiment of the invention utilizing the fan, the fins are only approximately 1.5" tall while the main wall 50 is approximately 0.5" thick. Power for the thermoelectric chip is provided by a circuit 161 which is connected to a plug 162 which may be used in conjunction with the cigarette lighter of the vehicle. A plurality of legs 165 depend downwardly from the planar bottom portion 113 of the invention to assist in steadying the apparatus on the floor or dashboard of a vehicle. A control box 170 is provided having switching means 171 to assist in the reversing of the plurality of the thermoelectric chip to provide for the heating or cooling of the beverage contained in the cup insert depending upon the desired temperature of consumption.

What is claimed is:

1. A thermoelectrically cooled drinking container for use in an automotive vehicle in conjunction with a beverage, said drinking container comprising, a cup portion, said cup portion having a handle secured thereto, said cup portion having a cup insert removably detachable from an insulative shell, said shell having a cylindrical side wall, a top edge, and a bottom planar portion, said cup portion having a heat conductive portion positioned between said insulative shell and said cup insert, said cup insert secured just inwardly of said insulative shell, said drinking container facilitating the drinking directly therefrom of a beverage, a thermoelectric chip, said thermoelectric chip positioned between a heat sink and said heat conductive portion, and means for supplying power for said thermoelectric chip.

2. The drinking container according to claim 1 wherein said heat conductive portion is positioned between said bottom planar portion and said cup insert, and said bottom planar portion has a bottom surface, said bottom surface being positioned directly adjacent to said heat sink, said heat sink at least partially enclosing a fan, said fan connected to said means for supplying power.

3. The drinking container according to claim 2 wherein said cup insert is fabricated from a heat conductive material.

4. The drinking container according to claim 3 wherein said heat sink is comprised of a main wall and a plurality of fins depending perpendicularly therefrom.

5. The drinking container according to claim 1 wherein said cup insert is fabricated from a heat conductive material.

6. The drinking container according to claim 5 wherein said heat conductive portion forms a heat conductive sheath, said sheath extends about said cup insert, said sheath being positioned between cup insert and insulative shell.

7. The drinking container according to claim 6 wherein said heat sink is comprised of a main wall and a plurality of fins depending perpendicularly therefrom.

8. The drinking container according to claim 7 wherein said sheath is cylindrical and is directly adjacent to said cup insert.

9. The drinking container according to claim 8 wherein said cup portion has an insulated cover.

10. The drinking container according to claim 9 wherein said insulated cover at least partially encloses a top plate.

11. The drinking container according to claim 10 wherein said thermoelectric chip may have its polarity reversed.

12. The drinking container according claim 11 wherein said means for supplying power is connected to an adapter, said adapter capable of connection to the electrical system of said automotive vehicle.

13. A thermoelectrically cooled drinking container for use in an automotive vehicle in conjunction with a beverage, said drinking container comprising, a cup portion, said cup portion having a handle secured thereto, said cup portion having a cup insert removably detachable from an insulative shell, said shell having a cylindrical side wall, a top edge, and a bottom planar portion, said cup portion having a heat conductive portion positioned between said insulative shell and said cup insert, said heat conductive portion forming a cylindrical heat conductive sheath, said sheath being positioned between said cup insert and said insulative shell directly adjacent said cup insert, said cup portion also having an insulated cover at least partially enclosing a top plate, said drinking container facilitating the drinking directly therefrom of a beverage, a thermoelectric chip, said thermoelectric chip positioned between a heat sink and said heat conductive portion, said heat sink comprised of a main wall and plurality of fins depending perpendicularly therefrom, and means for supplying power for said thermoelectric chip.

14. A drinking container for use in an automotive vehicle in conjunction with a beverage, said drinking container comprising, a cup portion, said cup portion having a cup insert removably detachable from an insulative shell, said shell having a cylindrical side wall, a top edge, and a bottom planar portion, said cup portion having a heat conductive portion positioned between said insulative shell and said cup insert, said cup insert secured just inwardly of said insulative shell, said drinking container facilitating the drinking directly therefrom of a beverage, a thermoelectric chip, said thermoelectric chip positioned between a heat sink and said heat conductive portion, and means for supplying power for said thermoelectric chip.

* * * * *